(12) United States Patent
Zhao et al.

(10) Patent No.: US 7,757,198 B1
(45) Date of Patent: Jul. 13, 2010

(54) SCAN CHAIN SYSTEMS AND METHODS FOR PROGRAMMABLE LOGIC DEVICES

(75) Inventors: Jun Zhao, Allentown, PA (US); Yanhua Yi, Allentown, PA (US); Eric Ting, Macungie, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 433 days.

(21) Appl. No.: 11/875,748

(22) Filed: Oct. 19, 2007

Related U.S. Application Data

(60) Provisional application No. 60/911,002, filed on Apr. 10, 2007.

(51) Int. Cl.
*G06F 17/50* (2006.01)
(52) U.S. Cl. .................... 716/16; 716/6; 716/17
(58) Field of Classification Search .............. 716/6, 716/16–17
See application file for complete search history.

(56) References Cited

U.S. PATENT DOCUMENTS

| | | | |
|---|---|---|---|
| 5,430,734 A | 7/1995 | Gilson | |
| 5,491,666 A | 2/1996 | Sturges | |
| 5,550,843 A | 8/1996 | Yee | |
| 5,815,404 A | 9/1998 | Goetting et al. | |
| 5,867,507 A | 2/1999 | Beebe | |

(Continued)

OTHER PUBLICATIONS

U.S. Appl. No. 11/875,700, filed Oct. 19, 2007, Foster et al.

*Primary Examiner*—Stacy A Whitmore
(74) *Attorney, Agent, or Firm*—Haynes and Boone, LLP

(57) ABSTRACT

Systems and methods provide techniques to support design specific testing for programmable logic devices in accordance with one or more embodiments. For example in one embodiment, a method of generating configuration data for a programmable logic device includes mapping a design for the programmable logic device, wherein the mapped design incorporates scan test logic; placing and routing the mapped design; and generating configuration data based on the mapped design, wherein the incorporated scan test logic is disabled and not selectable within the programmable logic device configured with the configuration data. The method may further include generating a second configuration data based on the mapped design, wherein the incorporated scan test logic is enabled and selectable within the programmable logic device configured with the second configuration data.

14 Claims, 10 Drawing Sheets

U.S. PATENT DOCUMENTS

| | | | |
|---|---|---|---|
| 6,071,314 A * | 6/2000 | Baxter et al. ............... 716/17 |
| 6,157,210 A | 12/2000 | Zaveri |
| 6,226,779 B1 * | 5/2001 | Baxter et al. ............... 716/16 |
| 6,664,808 B2 | 12/2003 | Ling et al. |
| 6,817,006 B1 | 11/2004 | Wells et al. |
| 6,891,395 B2 | 5/2005 | Wells et al. |
| 6,968,487 B1 | 11/2005 | Bryant |
| 7,007,250 B1 | 2/2006 | Bapat et al. |
| 7,047,465 B1 | 5/2006 | Trimberger |
| 7,127,697 B1 | 10/2006 | Wells et al. |
| 7,269,711 B2 | 9/2007 | Young |
| 7,406,642 B1 | 7/2008 | Lau |
| 7,414,429 B1 | 8/2008 | Kim |
| 7,469,371 B1 | 12/2008 | Bapat |
| 7,502,979 B2 | 3/2009 | Dastidar |
| 2001/0027548 A1 | 10/2001 | Kaneko |
| 2002/0194543 A1 | 12/2002 | Veenstra |
| 2003/0052713 A1 | 3/2003 | Langhammer |
| 2003/0120987 A1 * | 6/2003 | Savaria et al. ............... 714/726 |
| 2005/0081130 A1 * | 4/2005 | Rinderknecht et al. ...... 714/726 |
| 2005/0097416 A1 * | 5/2005 | Plunkett ............... 714/727 |
| 2005/0262465 A1 * | 11/2005 | Goyal ............... 716/18 |
| 2006/0059387 A1 * | 3/2006 | Swoboda et al. ............... 714/30 |
| 2006/0117274 A1 * | 6/2006 | Tseng et al. ............... 716/1 |
| 2006/0242499 A1 * | 10/2006 | Volz ............... 714/724 |
| 2006/0271904 A1 * | 11/2006 | Emerson et al. ............... 716/18 |

* cited by examiner

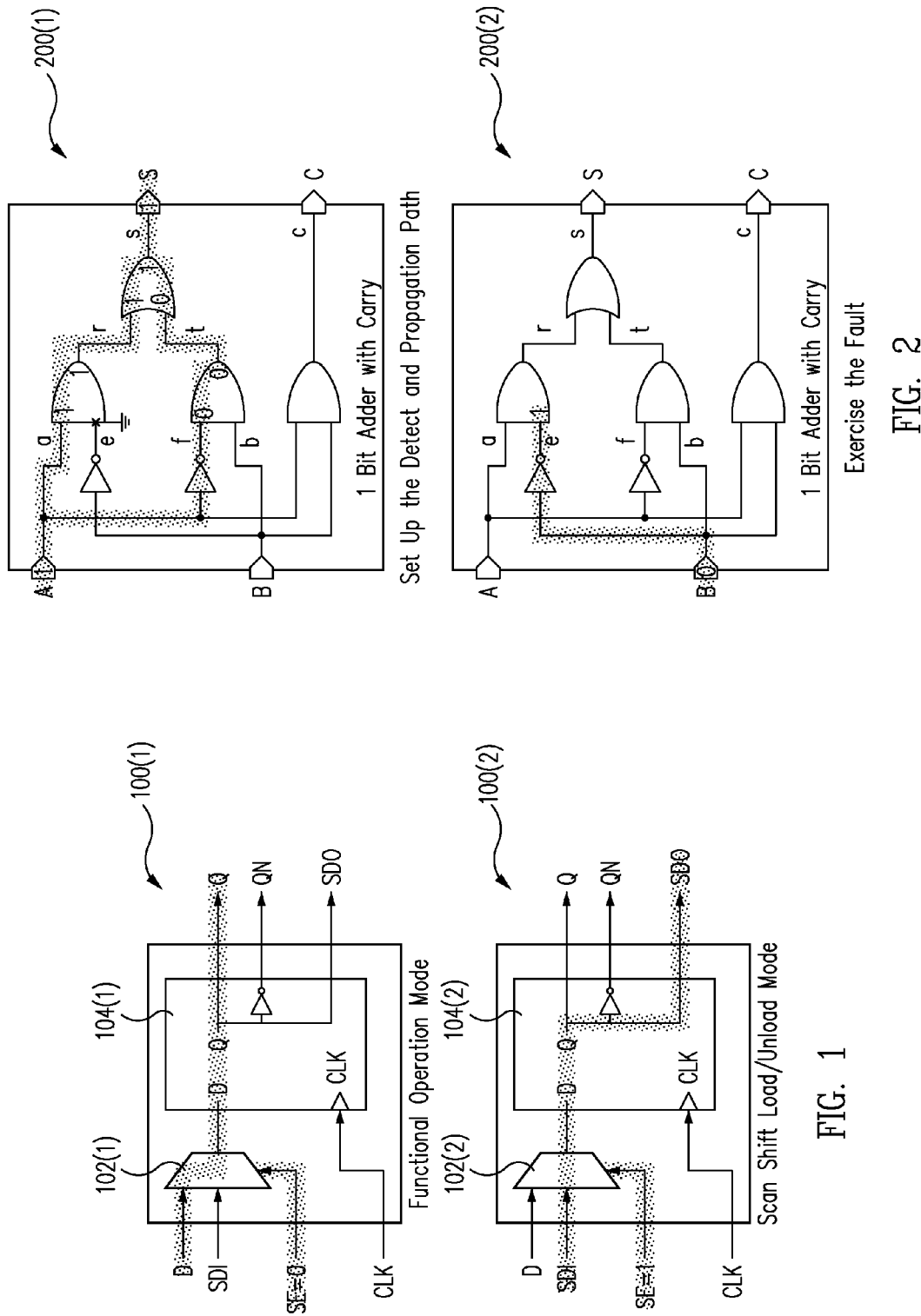

SCAN CHAIN SYSTEMS AND METHODS FOR PROGRAMMABLE LOGIC DEVICES

CROSS-REFERENCE TO RELATED APPLICATIONS

This patent application claims priority to U.S. Provisional Patent Application No. 60/911,002, filed Apr. 10, 2007, which is incorporated herein by reference in its entirety.

TECHNICAL FIELD

The present invention relates generally to programmable logic devices and, more particularly, to scan chain implementation techniques for programmable logic devices.

BACKGROUND

A programmable logic device (PLD), such as for example a field programmable gate array (FPGA) or a complex programmable logic device (CPLD), typically uses, for a given design configuration, only a fraction of the programmable multiplexer area. This provides certain advantages as the design is being debugged and optimized, because the programmable nature of the PLD permits design changes and modifications, such as to the connections between logic blocks. However, once the design is finalized, the majority of the programmable multiplexer area may be unused overhead (e.g., occupying in some cases over fifty percent of the total PLD fabric area). Thus, for example, localized defects that may exist in this unused programmable multiplexer or interconnect area may not have any effect on a specific design.

PLD test techniques may be viewed as being complicated by the programmable nature of the PLD, which can represent essentially an infinite number of specific design configurations. In general, there are no automated tools that are capable of generating test vectors for the PLD and thus, PLD test generation is a difficult task resulting in various proprietary procedures that are not uniform across the PLD industry. Consequently, this may make it difficult for users to determine an independent measure of the quality of testing for their specific design.

As an example, a conventional approach that may be employed to determine if a PLD with localized defects is functional for a specific user design uses many different test configurations of the PLD to attempt to isolate defective elements in the physical structure of the PLD. A list of defective elements may be generated and then compared to the list of elements used in the specific design to determine functionality. However, there may be a number of drawbacks with this conventional approach. First, the method to isolate the individual defective element requires a unique set of connections to that element, which are not guaranteed to match that used in the specific user design, with the result being "test coverage gaps" that will degrade product quality.

Second, the conventional approach does not use a rigorous fault sensitivity analysis and consequently, certain manifestations of the defect may not be observable even if the defective element is directly utilized in a test. For example, the test may pass a high logic level through a wire that is stuck high and conclude that the connection is not defective. Furthermore, because there is no industry standard tool to measure the resulting test coverage of this conventional approach, the precise quality of test is always uncertain and not independently verifiable.

As a result, there is a need for improved systems and methods for testing a PLD, such as for example to test a defect free PLD or a partially defective PLD for a specific user design. The systems and methods, for example, may provide techniques to fully test a specific PLD configuration, which may allow the use of a partially defective PLD that otherwise, would have been rejected by the PLD manufacturer. The systems and methods, for example, may further provide techniques to enable automated test techniques for test pattern generation for a specific PLD design and may provide for an industry standard measure of testing quality.

SUMMARY

In accordance with another embodiment of the present invention, a method of generating configuration data for a programmable logic device includes mapping a design for the programmable logic device, wherein the mapped design incorporates scan test logic; placing and routing the mapped design; and generating configuration data based on the mapped design, wherein the incorporated scan test logic is disabled and not selectable within the programmable logic device configured with the configuration data.

In accordance with another embodiment of the present invention, a programmable logic device includes a plurality of logic blocks; means for providing a block wrapper for certain circuits within the programmable logic device to support the test of a specific design implemented within the programmable logic device; a plurality of scan registers, wherein at least a first set of the scan registers are disposed within the logic blocks, and wherein the scan registers are adapted to form a scan chain to test a specific design implemented within the programmable logic device; and scan test logic associated with the scan chain, wherein the scan test logic is disabled and not selectable within the programmable logic device.

In accordance with another embodiment of the present invention, a computer-readable medium on which is stored one or more computer programs for performing a method that includes mapping a design for a programmable logic device, wherein the mapped design incorporates scan test logic; placing and routing the mapped design; and generating configuration data based on the mapped design, wherein the incorporated scan test logic is disabled and not selectable within the programmable logic device configured with the configuration data.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 1 shows a block diagram illustrating an example of a scan register implementation in accordance with an embodiment of the present invention.

FIG. 2 shows a block diagram illustrating an example of an automated test pattern generation for a circuit in accordance with an embodiment of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 3:
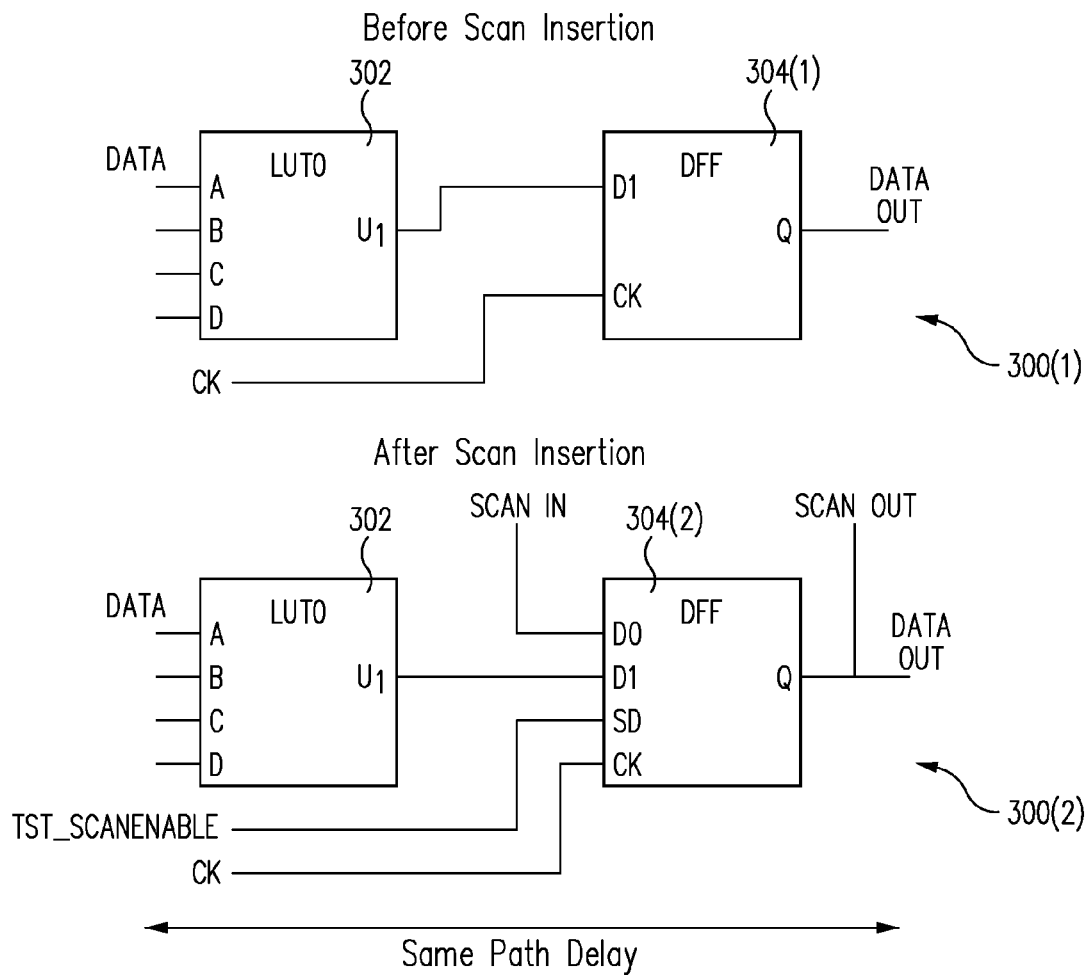
FIG. 3 shows a block diagram illustrating an example of a scan register implementation in accordance with an embodiment of the present invention.

Systems and methods are disclosed herein for designing, implementing, and/or testing a programmable device, such as a programmable logic device (PLD), in accordance with one or more embodiments of the present invention. The techniques disclosed herein may be used, for example, to test a defect free PLD or a partially defective PLD for a specific user design. As a specific example, the systems and methods may provide techniques to fully test a specific PLD configuration, which may allow the use of a partially defective PLD that would have been rejected by the PLD manufacturer. For example, using the techniques disclosed herein, automated test techniques may be employed for test pattern generation for a specific PLD design, which may provide for an industry standard measure of testing quality for PLDs.

One or more of the techniques disclosed herein may provide certain advantages over conventional approaches and may offer a more advantageous cost reduction path from initial design and prototype testing to production of the final design within a lower cost production platform. For example, a conventional approach of converting the final PLD design into an application specific integrated circuit (ASIC) typically involves various risks and costs associated with the complete re-layout of the design and possibly additional re-spins to complete the design. Furthermore, a conventional approach of providing a structured ASIC based on the PLD design typically involves risks similar to the pure ASIC approach, but with a reduction in some potential benefits. Another conventional approach, for example, attempts to utilize a PLD with localized defects for a specific design, if the localized defect can be avoided for that specific design. However, conventional existing industry solutions for this approach have not been able to develop adequate test solutions (e.g., complete and thorough test procedures that are verifiable) or appropriate procedures for locating and avoiding the defect (e.g., locating the defect and mapping relative to the specific user design).

In contrast in accordance with one or more embodiments of the present invention, systems and methods are disclosed that may utilize, for example, the base PLD die as the cost reduction platform, therefore avoiding the risk and costs associated with ASIC and structured ASIC solutions. Consequently for example for some embodiments, risks, costs, and time may be reduced, relative to some conventional approaches from prototype to volume delivery production, as the PLD used for initial design and prototype may have the same physical and electrical characteristics as the PLD used for production. Furthermore, ASIC-type test techniques may be applied in accordance with some embodiments to comprehensively test the PLD based on a user's specific design, which may provide test quality (e.g., up to or greater than 99% fault coverage) superior to conventional PLD test techniques.

Specifically in accordance with one or more embodiments of the present invention, an ASIC-type design methodology is disclosed and applied to the PLD, with the design methodology ensuring that there are accessible hardware test points that allow a tester to apply test vectors that can achieve high quality results. This design methodology is referred to herein as scan-based testing (or scan test) and uses a scan-based architecture, which allows for example any registered data state to be placed within the PLD using scan shift registers. The scan-based testing also allows the data state of the PLD to be observed by using those same scan shift registers. This capability facilitates the use of algorithmic software tools to generate the necessary structural test vectors to verify the PLD is defect free to a quantifiable level. Thus, the scan test is a highly structured methodology that may provide significant advantages over the conventional alternatives in that it may be standardized in the industry, may be a repeatable process, and may be easily automated. The automation of test vectors that have quantifiable quality results is a process referred to herein as automatic test pattern generation (ATPG).

In accordance with one or more embodiments of the present invention, techniques are disclosed directed to the implementation of scan shift registers within the PLD to allow the application of the scan-based testing design methodology. Furthermore in accordance with one or more embodiments of the present invention, techniques are disclosed directed to the implementation and use of software to facilitate the user's design for the PLD and for the application of the scan-based testing design methodology.

As an example, FIG. 1 shows a block diagram illustrating an implementation example of a scan register 100 in accordance with an embodiment of the present invention. Scan register 100 may be viewed as dual-input shift register and may be represented, in an exemplary implementation, as including a register 104 and a 2-to-1 multiplexer 102 providing a selectable input signal to register 104. Scan register 100(1) illustrates a normal functional operation mode for scan register 100, such as during a user mode of PLD operation for a particular design, while scan register 100(2) illustrates a shift mode (labeled scan shift load/unload mode) for scan register 100, such as during scan-based testing of PLD operation for a particular design.

For example for scan register 100, one input to multiplexer 102 is for a normal design signal (D) and the other input to multiplexer 102 is for an output signal (SDI) of another register 100 (not shown) within the PLD. As a specific example, output signal (e.g., SDO) of scan register 100 may be provided (e.g., via intervening logic or other circuit elements) as input signal (e.g., SDI) to multiplexer 102 of another scan register 100 (not shown), thus forming a scan chain that serially connects from a scan input port of the PLD, through each scan register 100 within the PLD, and then out from a scan out port of the PLD. When the scan chain is placed in test mode, based on a multiplexer select signal (SE, e.g., with value SE=1 for test mode), all of scan registers 100 may be loaded with data by serially shifting it in on the scan chain one clock at a time. Additionally, values in scan registers 100 may be observed by serially shifting the data out through the scan chain one clock at a time.

The scan test may be viewed as reducing test complexity by substituting all registers in a design with scan registers 100. Furthermore, in contrast to some conventional approaches, the scan chain may reduce the number of sequential tests required to find faults. For example, in accordance with an embodiment of the present invention, many faults may be tested with a single clock cycle, which may greatly simplify test generation problems and may allow automated tools to achieve close to 100% test coverage and may minimize the number of test vectors required.

The automatic test pattern generation (ATPG) technique is illustrated in FIG. 2, which shows a block diagram illustrating an application example of the ATPG technique for a circuit 200 in accordance with an embodiment of the present invention. The ATPG algorithm operates on a gate level netlist and treats all inputs and outputs of each gate as a potential fault site. For example, a fault can manifest itself as either having the node stuck high or stuck low. Therefore, for each fault site and stuck position, the ATPG algorithm determines a detect and propagation path to observe the fault test result (e.g., as illustrated as an example by the highlighted paths of circuit 200(1) for circuit 200). The ATPG algorithm then generates the necessary test vectors to exercise the fault (e.g., as illustrated as an example by the highlighted paths of circuit 200(2) for circuit 200) if a previously generated set of test vectors failed to exercise the fault. The ATPG algorithm continues this process for every fault in the design for the PLD. As an example, a typical PLD design may contain over 750,000 potential fault sites, but by applying the techniques disclosed herein, high fault coverage of large designs may be easily achievable.

In accordance with one or more embodiments of the present invention, the techniques disclosed herein provide for the implementation of a scan-based architecture into the PLD fabric and utilizes the ATPG process for test vector generation, which may allow a PLD user to obtain the benefits of world class test quality. Furthermore, the techniques disclosed herein may be applied such that the PLD manufacturing flow after normal PLD testing may achieve the highest possible quality device for volume production. Additionally, when applied as an integral part of a PLD cost reduction process, the techniques disclosed herein may provide a powerful advantage over some conventional approaches. Therefore in accordance with one or more embodiments of the present invention, the techniques disclosed herein may provide a number of silicon and software design techniques to achieve ASIC-level testing in a PLD fabric.

It should be understood that one or more of the techniques disclosed herein may be employed in some form within current PLD architectures, such as for example the Lattice SC PLD architecture provided by Lattice Semiconductor Corporation, but this is not limiting and is simply an example of a specific implementation of one or more techniques disclosed herein. Furthermore it should also be understood that one or more of the techniques disclosed herein may be employed in some form within current software products, such as for example the ispLEVER software provided by Lattice Semiconductor Corporation, but this is not limiting and is simply a specific example of an implementation of one or more techniques disclosed herein. Additionally, it should be understood that a specific example of one or more of the techniques disclosed herein and/or the PLD cost reduction methodology may be referred to as FreedomChip (e.g., FC, FreedomChip, FreedomChip testing, FreedomChip design flow, or FreedomChip architecture), such as in documents provided by Lattice Semiconductor Corporation, but this is not limiting and may be viewed as simply a reference to a specific example of an implementation of one or more techniques disclosed herein.

FIG. 3 shows a block diagram illustrating an implementation example of a circuit 300, which includes a lookup table (LUT) 302 and a dual-input register 304 in accordance with an embodiment of the present invention. Circuit 300 may represent a portion of a logic block within the PLD, with circuit 300(1) illustrating an implementation before insertion of scan test features for register 304 (e.g., register 304(1)), while circuit 300(2) illustrates an implementation after insertion of scan test features for register 304 (e.g., register 304(2)). For example, register 304 may be implemented within the low-level structure of a logic block (e.g., also referred to as programmable logic block (PLB), programmable functional unit (PFU), programmable logic slice (PLS), or programmable logic cell (PLC)) within the PLD architecture. A number of registers 304 (e.g., incorporating a scan multiplexer) may be implemented within the logic block and/or within the PLD to support the scan test architecture, which may result in a lower gate overhead as compared to other conventional PLD architectures.

As an example, a plurality of registers 304 may be implemented within the Lattice SC (FPGA) PLD device. For this specific implementation, if registers 304 are connected to a global set reset (GSR) instead of a local reset, one of the two register inputs is available for other data, such as for example as the scan input for the FreedomChip flow, without requiring any additional logic overhead to construct the scan multiplexer for that register 304. Additionally for this specific implementation, because the scan register multiplexer delay is part of the normal data path through register 304, there is generally no speed or substantial timing impact when using the dual input multiplexer of register 304 (e.g., same path delay). It should be understood that this global set reset and local reset limitation is not limiting and would not be a necessary limitation for the general application of the techniques disclosed herein, but rather is specific for this specific implementation within the Lattice SC PLD device.

In general as shown in FIG. 3, circuit 300(1) (before scan insertion) and circuit 300(2) (after scan insertion) would generally have the same path delay. As an example during a normal mode of operation, LUT 302 may provide an output signal (e.g., a data signal) to an input terminal D1 of register 304, which may provide an output signal (Data Out) via an output terminal Q of register 304. During a scan test, a scan enable control signal (labeled TST_SCANENABLE) may provide an appropriate logical signal (e.g., a logical high level) to control register 304 to receive a scan in signal (SCAN IN) at an input terminal D0 and provide a scan out signal (SCAN OUT) via the output terminal Q of register 304 (register 304(2)).

Scan register 304 (e.g., dual input scan register) may be automatically instantiated into the user design via PLD design software (e.g., such as with the ispLEVER® design tool suite in FreedomChip flow), as discussed further herein, and may be transparent to the designer. For example as explained further herein, the scan chain may be ordered automatically and routed after the user design has been routed to minimize any impact on design performance.

In accordance with one or more embodiments of the present invention, the techniques disclosed herein, unlike some ASIC implementations of a scan architecture, may be implemented without requiring dedicated or shared pin functions for the test control pins or the scan in and scan out pins. For example, no PLD input/output I/O paths are required to be sacrificed or multiplexed to implement the techniques disclosed herein.

Figure 4:
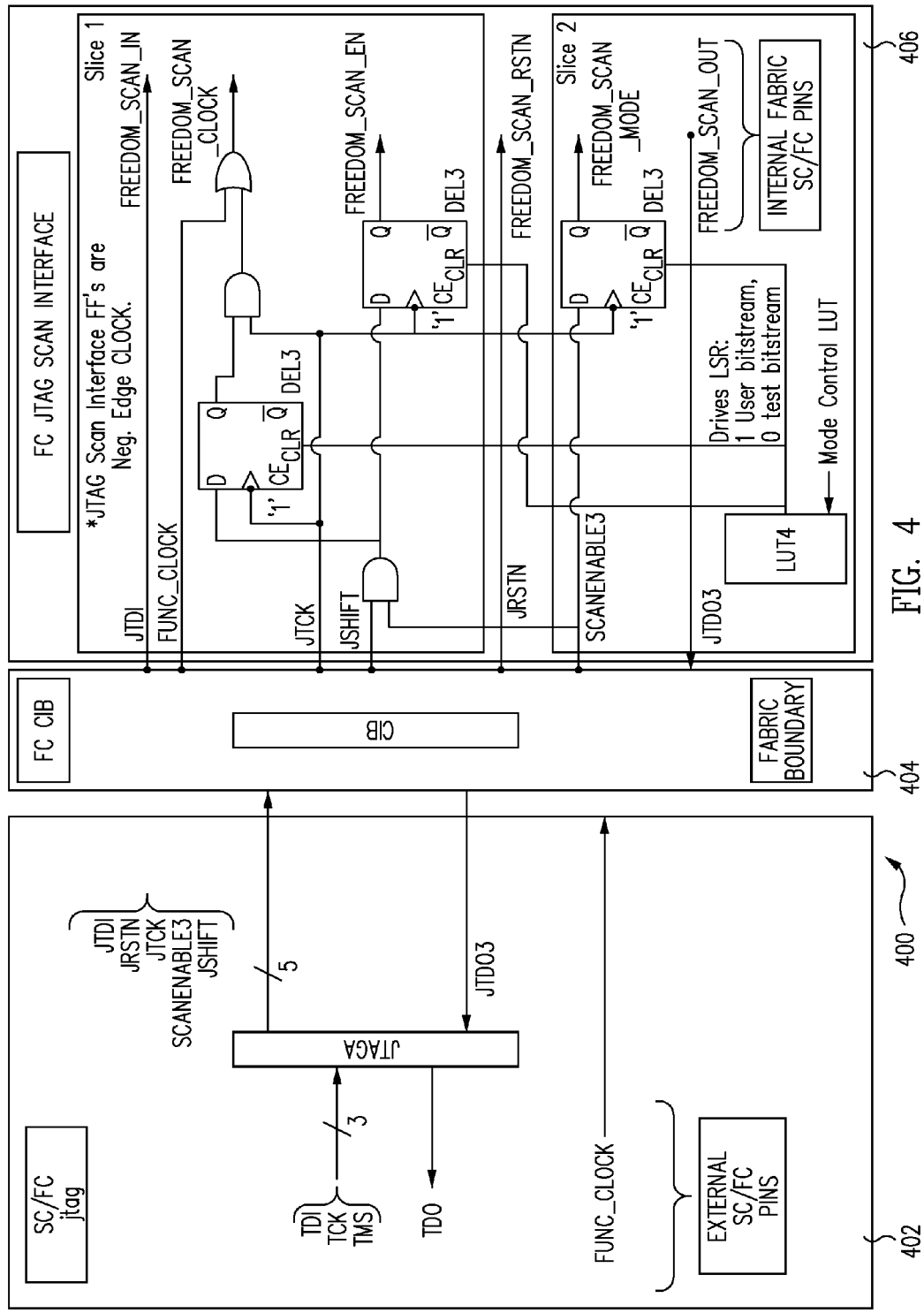
FIG. 4 shows a block diagram illustrating an example of a joint test action group interface implementation in accordance with an embodiment of the present invention.

As a specific implementation example in accordance with one or more embodiments of the present invention, the entire test interface may be accessed through a standard JTAG port of the PLD and/or configuration mode pins not utilized for example by the functional user design. For example, FIG. 4 shows a block diagram illustrating an implementation example of a joint test action group (JTAG) interface 400 in accordance with an embodiment of the present invention. JTAG interface 400 of the PLD may include a JTAG port 402, a common interface block (CIB) 404, and a scan test interface 406. JTAG port 402 receives external JTAG signals and provides desired internal signals (e.g., JTAG signals and scan test signals as would be understood by one skilled in the art) to CIB 404, which serves as an interface between JTAG port 402 and scan test interface 406. In accordance with one or more embodiments of the present invention, JTAG interface 400 may be automatically generated by PLD design software (e.g., ispLEVER software in the FreedomChip flow) and may be transparent to the designer using the PLD design software.

Scan test interface 406, which for example may be implemented by using one or more logic blocks of the PLD, provides various scan test signals. For example, scan test interface 406 may provide scan in and scan out signals (labeled FREEDOM_SCAN_IN and FREEDOM_SCAN_OUT, respectively), a scan enable signal (labeled FREEDOM_SCAN_EN) to control scan registers (e.g., scan enable signal corresponding to scan enable control signal labeled TST_SCANENABLE of FIG. 3), and a scan mode signal (labeled FREEDOM_SCAN_MODE) to control the bypassing of certain circuit blocks within the PLD (e.g., block wrapper as discussed further herein). Various other signals may also be provided, such as a clock signal (labeled FREEDOM_SCAN_CLOCK) and a reset signal (labeled FREEDOM_SCAN_RSTN) as shown.

It should be understood that JTAG interface 400 represents a specific exemplary implementation, but this is not limiting and that one skilled in the art would recognize that various modifications and variations are possible that would fall within the principles of the present invention. For example, JTAG interface 400 may be implemented as a specific implementation example within the Lattice SC family to provide a JTAG block to support internal scan paths for the FreedomChip flow. Furthermore, there may be additional advantages in having the entire scan test interface accessible through a JTAG port. For example, as internal JTAG (IJTAG) standards become available, the techniques disclosed herein may be applied and designed to comply with advanced in-system diagnostics and testing requirements.

As noted herein, certain circuit blocks, such as application specific blocks (e.g., embedded memory, embedded structured ASIC blocks, physical coding sublayers (PCS) and other signal interface circuits, or system bus structures) may require special treatment during the ATPG process (e.g., by the ATPG software tool) to achieve the highest possible test coverage. For example, these application specific blocks may create "shadowing effects" on the fault sites that exist downstream from the application specific block's output signals and, if not addressed, may degrade fault coverage. A common approach for ASIC applications is to build a "wrapper" (or block wrapper) around the circuit block.

In accordance with one or more embodiments of the present invention, one wrapper approach is to implement a register wrapper that essentially creates capture registers (e.g., registers 100 or 304) on the inputs of the application specific block and launch registers on the outputs of the application specific block, with these capture registers included as part of the scan chain. An alternative wrapper approach, in accordance with one or more embodiments of the present invention, is to design a bypass path around the application specific block from all of its inputs to all of its outputs.

Figure 5:
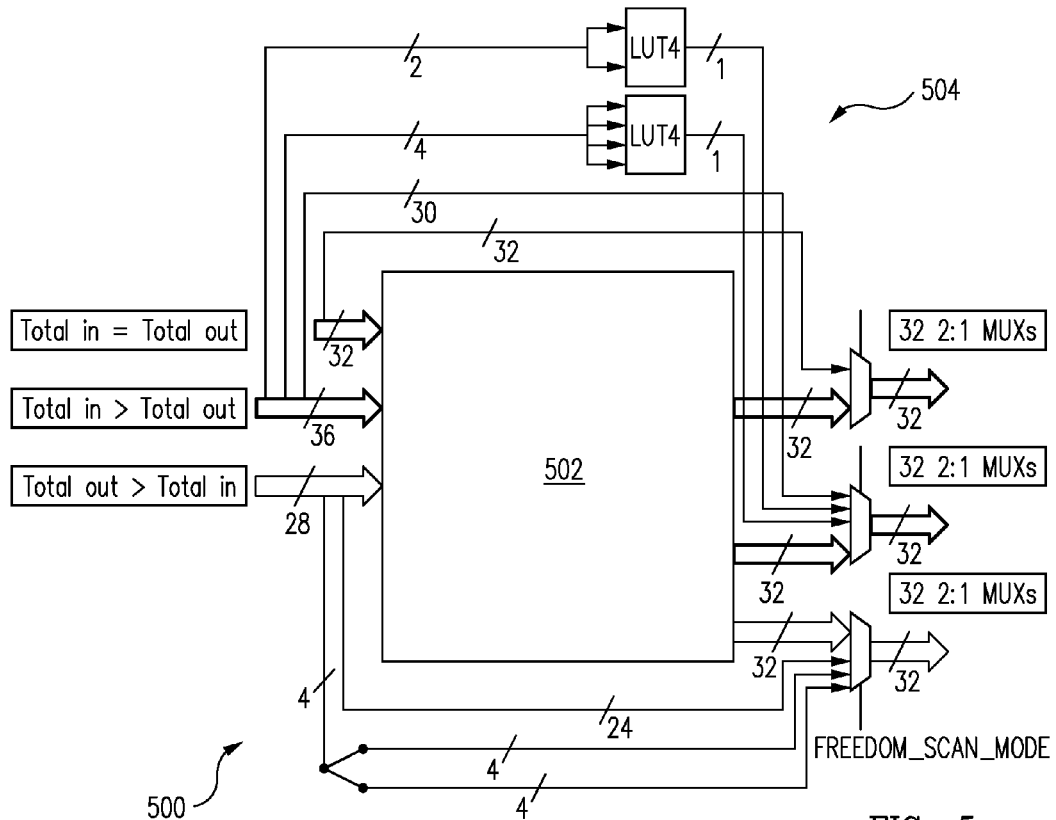
FIG. 5 shows a block diagram illustrating an example of a block wrapper implementation for testing in accordance with an embodiment of the present invention.

For example, FIG. 5 shows a block diagram of a circuit 500 illustrating an implementation example of a block wrapper bypass path for testing in accordance with an embodiment of the present invention. Circuit 500 includes an application specific block 502 and a bypass path 504, which may comprise one or more bypass paths and associated circuitry (e.g., means such as multiplexers or other logic) to provide the wrapper approach. Bypass path 504 may be switched in during test mode and may provide more efficient silicon utilization as compared to the register wrapper approach. The wrapper approach (e.g., register wrapper or bypass path) may be automatically implemented in the design by PLD design software (e.g., ispLEVER software in the FreedomChip flow) and may be transparent to the designer using the PLD design software.

In general, the application of the techniques disclosed herein (e.g., to provide ASIC-like test quality) do not have any effect on the normal functioning of the user's design implemented within the PLD. For example, during normal operation, the functional input to the dual input scan register is used, while the scan chain input to the register is used only when the test mode is active. As another example, a block wrapper provided for an application specific block is essentially transparent to the designer in normal mode, with the associated signals bypassed only when the test mode is active. Furthermore, it is generally not possible for the design to accidentally enter the test mode, as this requires, for example in one embodiment, configuring logic (e.g., setting a Mode Control LUT, as shown in FIG. 4, to provide a logical low) and providing a specific set of instructions through the JTAG port.

With respect to the techniques disclosed herein, the design flow (e.g., FreedomChip flow) may be functionally verified in an identical manner as that for the normal PLD design flow (e.g., Lattice SC FPGA flow). For example, a series of "co-verification" patterns may be developed for every PLD family. These patterns exercise all of the library elements available in that PLD family. These patterns may also be run through the design flow disclosed herein and the resulting bit-stream programmed into a PLD, with functional vectors run to assure equivalency (e.g., logic equivalency testing). Furthermore as discussed further herein, the PLD software (e.g., ispLEVER software) may provide the ability to produce post place and route (PAR) gate-level netlists, because the techniques disclosed herein may be part of the user design as it is built up rather than a post-design conversion, a user may check the functionality of their designs at any time during the normal PLD (e.g., FPGA) design process for further verification.

The testing techniques disclosed herein (e.g., fabric and block testing), in accordance with one or more embodiments of the present invention, may be viewed as a breakthrough for PLDs in that the exact user netlist is back annotated to a gate model equivalent, from which vectors are generated using ATPG. Consequently as an example, industry standard tools (e.g., Synopsys Tetramax) may be used to generate these vectors to achieve typically 99% or greater fault coverage. This may be referred to as the Fabric testing, because the great majority of the netlist is contained within the PLD fabric that includes the logic blocks (e.g., PFU) and the associated routing (e.g., programmable interconnect) of this logic. Furthermore, the user I/Os and the scan chain registers may be considered inputs and outputs by the ATPG tool and may be utilized in the generation of test vectors.

The resulting vectors may be integrated into a custom test program containing the user test pattern representing the customer's exact netlist and then applied during actual silicon testing on Automatic Test Equipment. In such a netlist, the conventional ASIC approach when using an industry standard tool (e.g., such as Tetramax) is to "black box" all of the embedded macro blocks in the design. This technique may be applied in a similar fashion, based on the techniques disclosed herein. For example, in the netlist that is used in ATPG, these black boxes are "wrapped" so test signals may bypass these black boxes to achieve the highest possible fault coverage.

Figure 6:
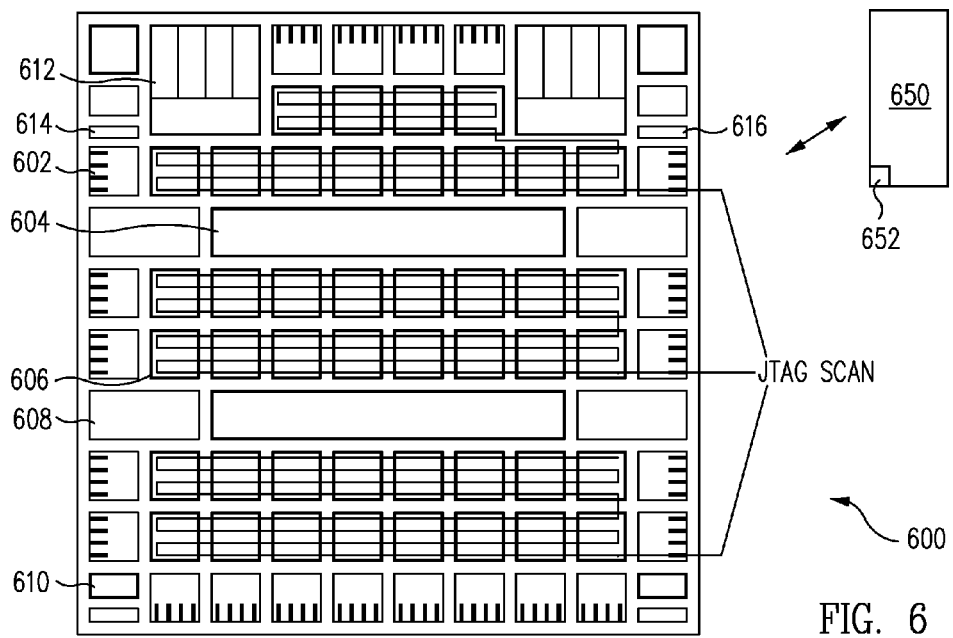
FIG. 6 shows a block diagram illustrating an example of a programmable logic device system in accordance with an embodiment of the present invention.

FIG. 6 shows a block diagram illustrating an example of a PLD 600 in accordance with an embodiment of the present invention. PLD 600 generally includes programmable I/O 602 (e.g., configurable I/O), embedded memory 604 (e.g., blocks of EEPROM, block SRAM, and/or flash memory), logic blocks 606, application specific blocks 608 (e.g., a specific implementation example may be referred to as masked array for cost optimization (MACO), which represents for example an embedded structured ASIC block), clock circuits 610 (e.g., PLL and/or DLL circuits), interface circuits 612 (e.g., SERDES and embedded PCS for high-speed communication protocols), configuration memory 614, and routing resources 616 (e.g., programmable interconnect). As shown in FIG. 6, PLD 600 also illustrates as an example a simplified illustration of a scan chain via scan chain registers and JTAG interface, as disclosed herein in accordance with one or more embodiments of the present invention.

It should be understood that the number and placement of the various elements is not limiting and may depend upon the desired application. For example, various elements (e.g., embedded memory 604 or application specific blocks 608) may be optional and various other elements may not be required for a desired application or design specification (e.g., type of programmable device). Furthermore, it should be understood that the elements are illustrated in block form for clarity and that certain elements (e.g., configuration memory 614 or routing resources 616), would typically be distributed throughout PLD 600, such as in and between logic blocks 606, to perform their conventional functions (e.g., storing configuration data that configures PLD 600 or providing interconnect structure). It should also be understood that the various embodiments of the present invention as disclosed herein are not limited to programmable logic devices, such as PLD 600, and may be applied to various other types of programmable devices, as would be understood by one skilled in the art.

PLD 600 may be initially programmed, for example, by a user via a PLD design tool (e.g., a software design tool such as a computer program stored on a computer-readable medium for execution by a computer), which may be used during the PLD design process to generate configuration data and program the PLD, as would be understood by one skilled in the art. For example in accordance with an embodiment, a device 650 (e.g., a computer as shown in FIG. 6) may be used to run PLD design tool software stored in memory 652 to perform the PLD design process and to generate configuration data and program the PLD according to the techniques disclosed herein, as would be understood by one skilled in the art. In general, device 150 with memory 652 may be used to implement various techniques disclosed herein, such as to perform the software flows and provide the various software tools for the user. Memory 652 (e.g., a computer readable medium) may be a permanent memory (e.g., a fixed hard drive) within device 650 or may represent portable memory (e.g., portable hard drive, compact disk, flash memory, or other type of memory) capable of storing the PLD design tool software and couplable to device 650 to allow access to its information. The PLD design tool software may incorporate the techniques disclosed herein generally, as would be understood by one skilled in the art, to permit a user for example to generate a design, perform software flows, design methodologies, test, and program PLD 600.

In general, various circuits, such as for example the SERDES and PCS of interface circuit 612, embedded memory 604, application specific blocks 608, and/or the PLL/DLL of clock circuit 610, may undergo the same rigorous tests that are in the standard PLD test flow. For example, all functions and modes of these blocks may be verified, no matter in which specific configuration the user has the block programmed. Programmable I/O 602 may be tested in both the fabric and block tests (e.g., tested in the fabric test due to the ATPG requirement of access to all primary I/Os in the design and, for purposes of ATPG, the I/Os for example may be converted to standard LVCMOS output equivalents and bidirectional pins set as outputs). For example, the connections in programmable I/O 602 may be left exactly as they are in the user design and so are tested using the ATPG vectors. Additionally, programmable I/O 602 may be fully tested in the block mode to a PLD manufacturer's system I/O bus standards that are supported and tested in the standard PLD flow. Consequently, a user may perform field changes to parameters, such as for example voltage levels, drive strength, and slew rate.

The complete testing of the various macro blocks (e.g., embedded memory 604, PCS of interface circuit 612, system bus of programmable I/O 602 or routing resources 616, or application specific blocks 608) may provide some flexibility for the user. For example, because the SERDES-PCS block of interface circuit 612 may be fully tested, parameter settings affecting for example equalization and/or pre-emphasis may be performed. For PLLs of clock circuits 610, all input control signals may still be available for controlling divide, delay, and phase parameters. However, changes affecting the netlist are generally not permitted, as this would degrade test coverage. For example, changes in LUT content of logic block 606 or architecture of embedded memory 604 would generally change the exact netlist and therefore, would not be allowed.

Figure 7:
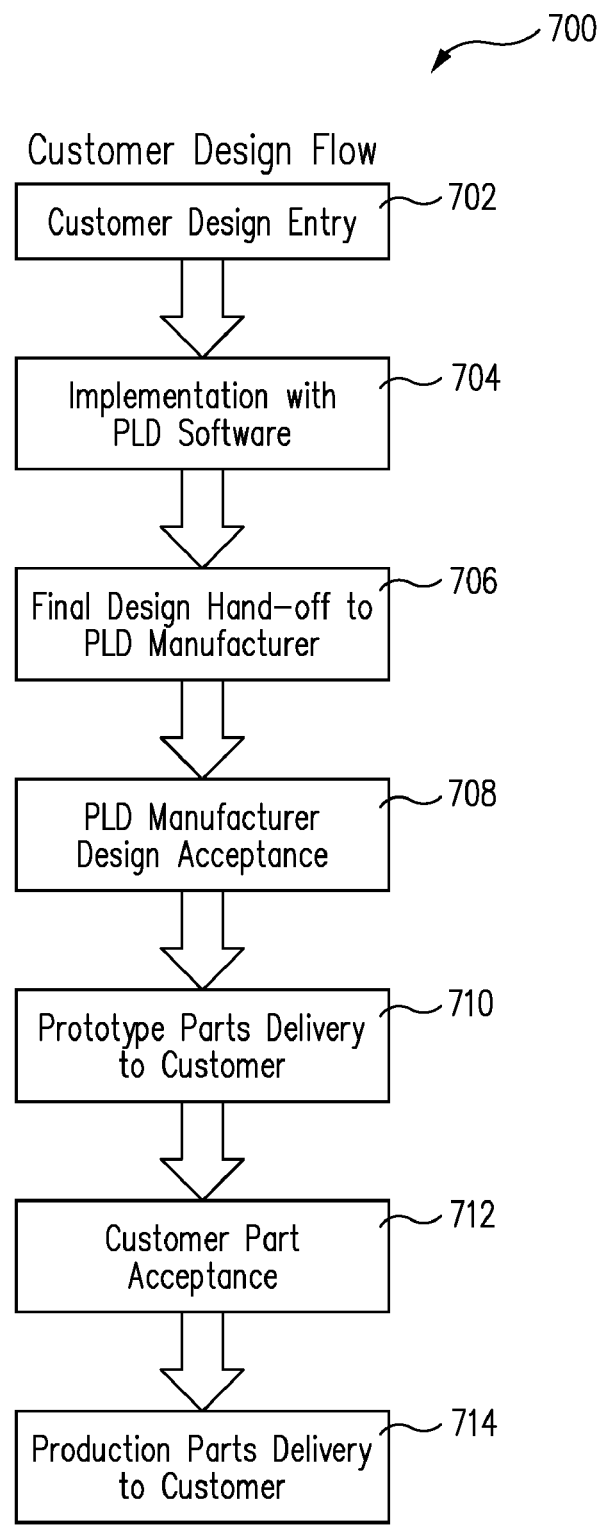
FIG. 7 shows a block diagram illustrating an example of a design flow in accordance with an embodiment of the present invention.

FIG. 7 shows a block diagram illustrating an example of a design flow 700 in accordance with an embodiment of the present invention. Design flow 700 illustrates an example of a customer design flow (blocks 702 through 714) generally from customer design entry (block 702) through production parts delivery to the customer (block 714). For example, a specific design flow implementation may include Lattice Semiconductor Corporation (Lattice) as the PLD manufacturer, with the PLD software being ispLEVER software having a FreedomChip flow for implementing scan-based testing as disclosed herein. However, it should be understood that this is not limiting, but simply a specific application example, and that various other PLD manufacturers and PLD design software may be utilized if the techniques disclosed herein are employed.

As shown in FIG. 7, the customer enters the design (block 702) and implements it (block 704) using the PLD design software (e.g., Lattice ispLEVER software). Once the design is completed and meets functional and timing requirements, the customer sends the entire project file (block 706) to the PLD manufacturer (e.g., Lattice). The PLD manufacturer may verify test coverage, generate the test program, and test first articles (block 708) and then deliver them to the customer for approval (block 710). After the customer approves the implemented design (block 712), the PLD manufacturer may then proceed with delivery of production parts to the customer (block 714). Thus, the customer performs blocks 702, 704, 706, and 712, while the PLD manufacturer performs blocks 708, 710, and 714.

In general in accordance with one or more embodiments of the present invention, the design methodology may be based on building a scan test methodology into a design from the beginning. The insertion of the necessary logic and connections may be automated for the customer and accomplished in the PLD design software (e.g., Lattice ispLEVER design software). However, there may be a few items that designers may need to take into consideration to take advantage of the design methodology flow.

For example, asynchronous design loops are generally not allowed, due to a requirement of the scan test methodology and due to the design practice generally being not recommended. As another example, additional area overhead is typically small, but may range for example generally from 0 to 5% additional logic. In general, the PLD design software may automatically insert the necessary scan test logic into the design and may convert retroactively a prior design (e.g., by copying the design as a new project to preserve the original design version).

Figure 8:
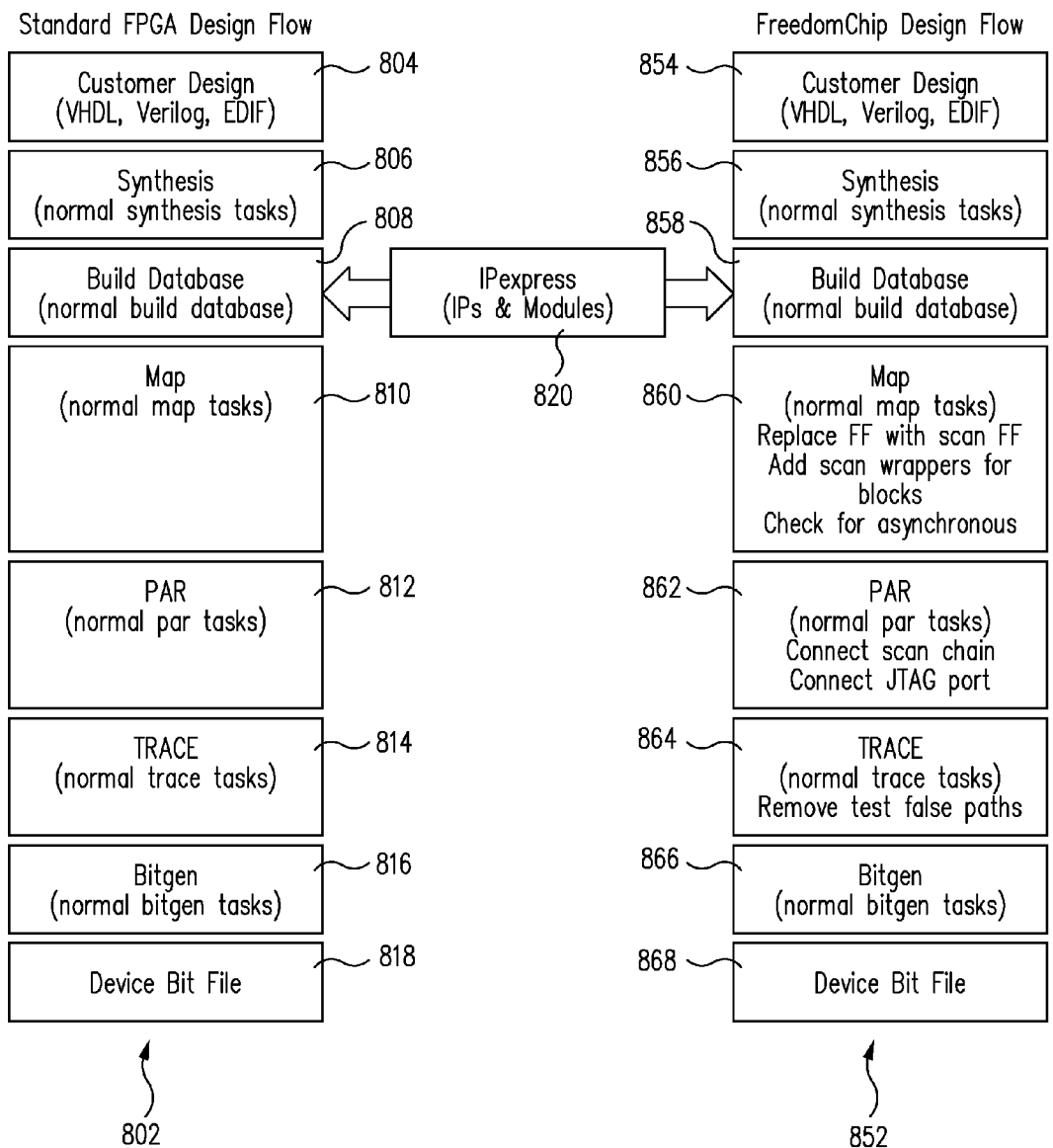
FIG. 8 shows a block diagram illustrating a comparison between a conventional design flow and an example of a design flow in accordance with an embodiment of the present invention.

From a user's perspective, the design process may be substantially identical to a standard design process. For example, FIG. 8 shows a block diagram illustrating a comparison between a conventional design flow 802 and an example of a design flow 852 in accordance with an embodiment of the present invention. As compared to design flow 802 (blocks 804 through 818, with block 820 common), design flow 852 (blocks 854 through 868, with block 820 common) performs the additional tasks, as discussed herein, in the background without user intervention. Note that Block 820 is an example of a software tool (IPexpress by Lattice Semiconductor Corporation) that enables users to fully parameterize IP in real-time and support the database build (as set forth in Block 808 or 858), but this is not limiting and various other conventional industry tools may be used in a similar fashion.

As shown, design elements may be added to the project in most formats, including VHDL, Verilog, EDIF, and even compiled NGO format netlists (block 804 or block 854), with the design flows progressing in a similar fashion. However, design flow 852 may differ from design flow 802, with for example blocks 860 through 864 of design flow 852 differing from corresponding blocks 810 through 814 of design flow 802. For example, during map, the additional scan test logic may be added to the design automatically by the PLD design software (block 860). For example, the scan registers (flip flops or FF, e.g., as discussed in reference to FIG. 1 or 3) may be added, block wrappers may be implemented (e.g., as discussed in reference to FIG. 5), the JTAG interface may be inserted (e.g., as discussed in reference to FIG. 4), and a check for asynchronous loops may be performed.

As another example, during place and route (PAR, block 862), the scan chain, including block wrappers, JTAG interface, and associated scan logic, may be fully placed and routed, with the scan chain routed and connected to the JTAG controller and port of the PLD automatically. Scan paths may not be included in TRACE reports (block 864) to eliminate false path reporting, as the scan paths are not used in normal device operation. Additionally, customer design elements may be placed and routed first to prevent the test logic from affecting the customer design constraints. Once the design is finished and timing requirements met, the project may be saved and archived.

The archived project may then be sent to the PLD manufacturer for device test program generation. The PLD manufacturer may perform a design rule check (DRC) on the design to make sure there are no testability issues. If there are no issues, then a special version of the design may be generated for testing that replaces the existing clock trees with a single clock tree for maximum testability access. This design may then be used for generating ATPG test vectors and testing the devices on the PLD tester. The customer may then receive all of the data for the design, including the original project, test vectors, test bitfile, test reports, and the programmed PLDs.

Figure 9:
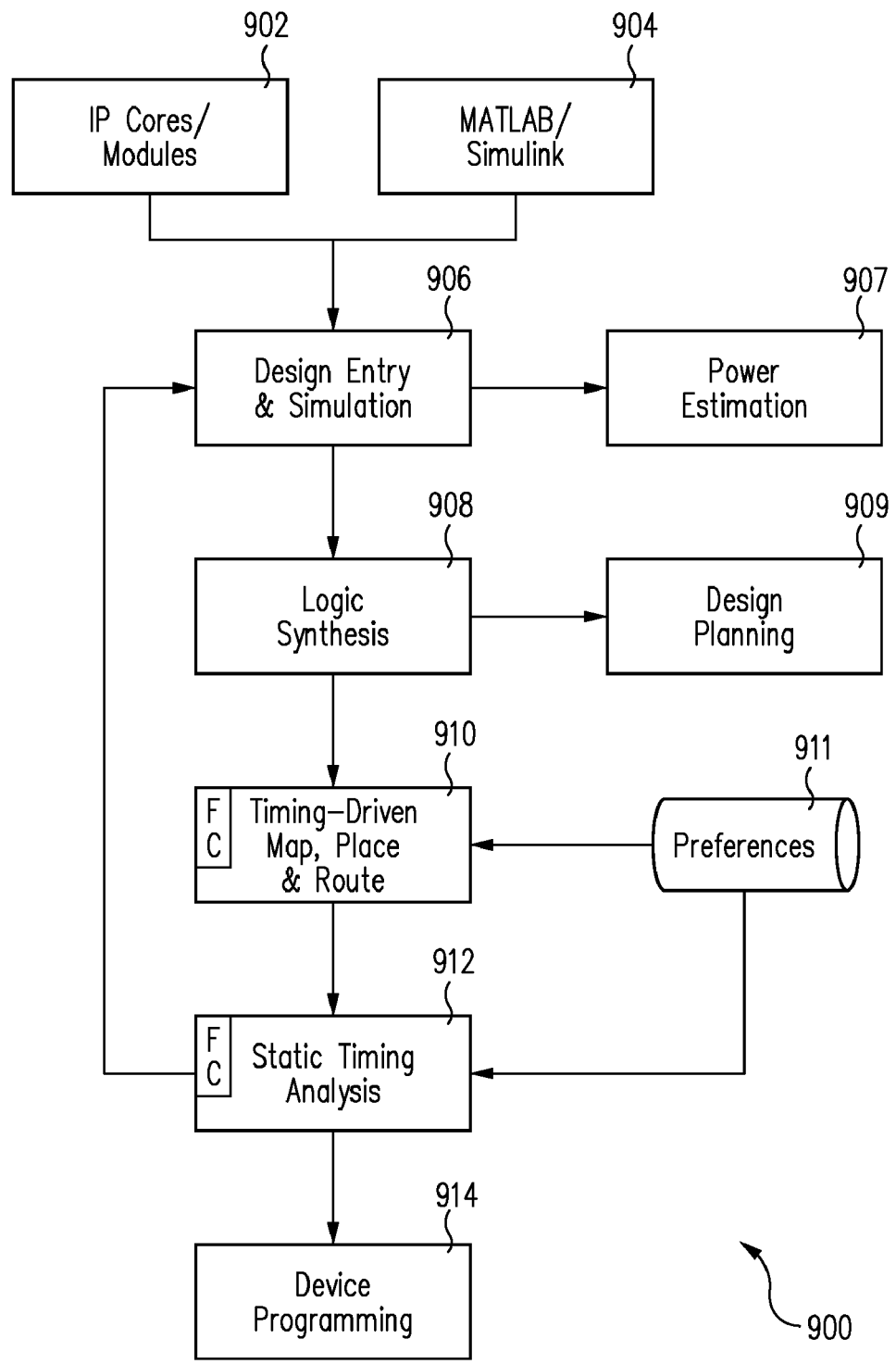
FIG. 9 shows a block diagram illustrating an example of a design flow overview in accordance with an embodiment of the present invention.

FIG. 9 shows a block diagram illustrating another example and overview of a design flow 900 in accordance with an embodiment of the present invention. As noted previously and as in this example, from a user's perspective the design process may be substantially identical to a standard design process. Design flow 900 includes a general design flow from initial design work to final device programming (blocks 902 through 914). However, design flow 900 may differ from a conventional design flow in terms of timing-driven map, place, and route (block 910) and static timing analysis (block 912), which may be performed automatically by the PLD design software. For example, design flow 900 may include instantiation of multiplexed flip flops (e.g., scan registers, such as register 100 or 304), adding wrappers for macro blocks (e.g., as discussed in reference to FIG. 5), inserting JTAG scan interface, checks for asynchronous loops, placing scan logic, including block wrappers and JTAG scan interface, and the ordering and connecting of the scan chain (block 910). As another example, design flow 900 may include removing false paths created by the scan chain prior to timing analysis (block 912).

Figure 10:
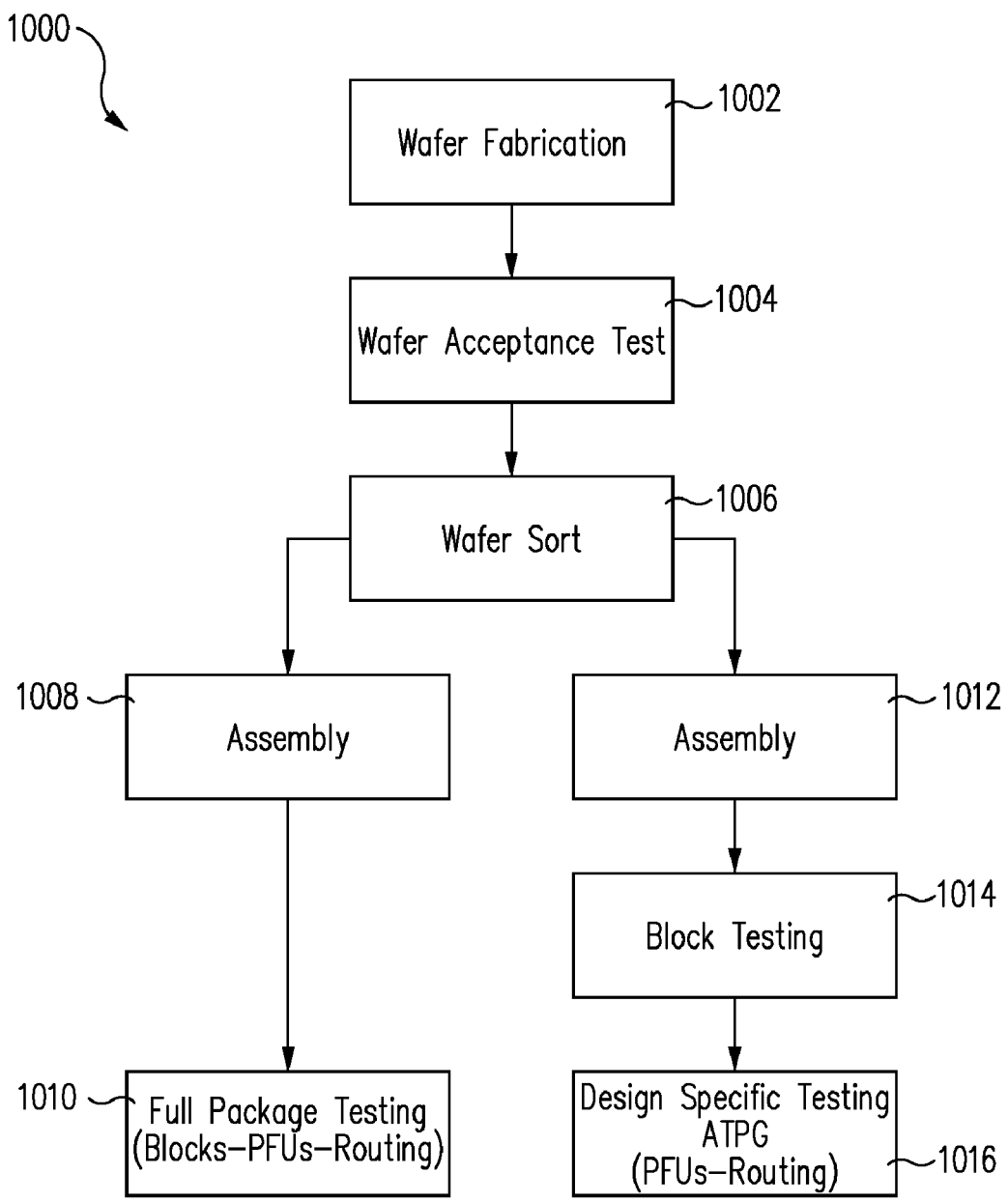
FIG. 10 shows a block diagram illustrating an example of a manufacturing flow in accordance with an embodiment of the present invention.

FIG. 10 shows a block diagram illustrating an example of a manufacturing flow 1000 in accordance with an embodiment of the present invention. Manufacturing flow 1000 illustrates the general manufacturing flow (generally blocks 1002 through 1016) of a PLD and the determination of whether a particular wafer (block 1006) will result in PLDs that pass all general PLD performance and validation tests (blocks 1006, 1008, and 1010) or will result in partially defective PLDs that pass all performance and validation tests (blocks 1006, 1012, 1014, and 1016) for a specific design.

Wafer fabrication (block 1002) and wafer acceptance test (block 1004) may represent conventional processes, while wafer sort (block 1006) determines whether the wafer (or individual die) are of sufficient quality to produce a substantially defective free PLD (blocks 1008 and 1010, which may represent a conventional process) or are of sufficient quality to produce a partially defective PLD (blocks 1012, 1014, and 1016) that would support design specific implementations. For example, a partially defective PLD die may be required to pass all block tests, have a minimum configuration bit pass count, and/or have a minimum embedded memory pass count to be eligible for blocks 1012, 1014, and 1016 of design flow 1000. Block 1016 may include various operations, as discussed herein in accordance with one or more embodiments (e.g., in reference to FIGS. 1-9), to implement and test a design specific configuration within the partially defective PLD.

Figure 11:
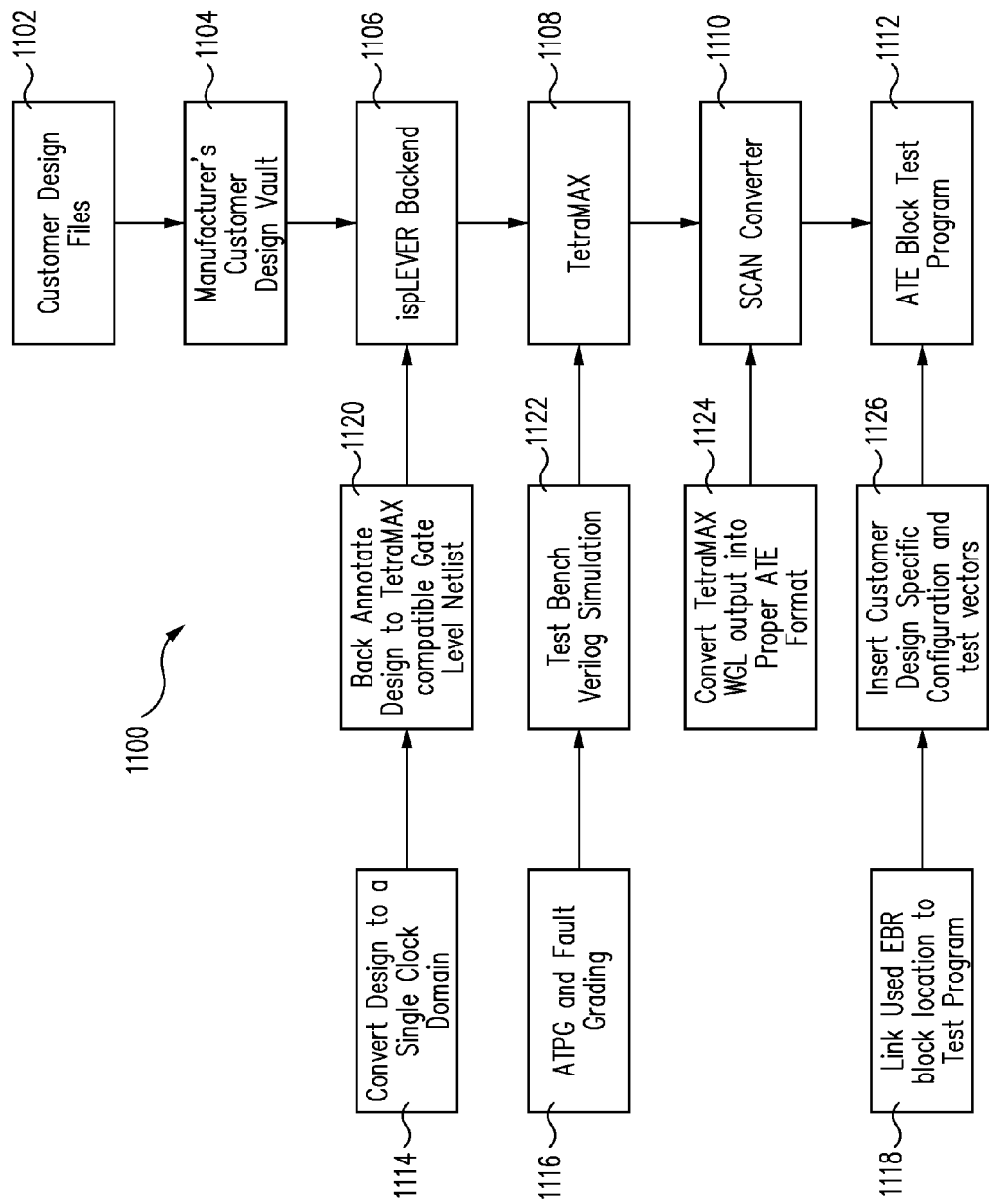
FIG. 11 shows a block diagram illustrating an example of a test generation flow in accordance with an embodiment of the present invention.

FIG. 11 shows a block diagram illustrating an example of a test generation flow 1100 in accordance with an embodiment of the present invention. Test generation flow 1100 illustrates a general test generation flow (generally blocks 1102 through 1126) of a customer specific design from the initial design files (block 1102) through an automatic test equipment (ATE) block test program (block 1112). The design files are provided to the PLD manufacturer (block 1104), where the design may be converted to a single clock domain (block 1114) and to a gate level netlist (block 1120) by software (block 1106). ATPG and fault grading (block 1116) and simulations (block 1122) may be performed based on test vectors generated (block 1108), which may be converted to a proper format (blocks 1124, 1110) for ATE block testing (block 1112) of the customer's specific design (block 1126) within the PLD based on techniques disclosed herein (e.g., in reference to FIGS. 1-10).

In general in accordance with one or more embodiments, the techniques disclosed herein provide a design methodology for scan-based testing by implementing a scan-based architecture within the PLD. For example as discussed herein (e.g., in reference to FIGS. 8 and 9), the map process may insert the scan logic into every register, wrap every non-scan-testable block (block wrappers), and add a scan chain interface to the user's design. The map process may further optimize the additional scan chain related logic with the user-desired logic for the user's design (e.g., combine appropriately the scan chain logic with the user's logic) to increase performance and minimize area overhead.

The place and route (PAR) process may then provide for the placement of scan chain related logic simultaneously with user logic to ensure both get fully placed. For example, the route process may rehook the scan chain by chaining scan registers in order of their physical locations (i.e., placement) and thus, the formed scan chain may provide optimal speed and minimal routing overhead. The router may also route the scan chain together with user nets to ensure all are routed, including the scan chain. Consequently, after map and PAR, the scan chain and scan logics have been integrated into the design and fully placed and routed.

In accordance with one or more embodiments, the scan chain and associated scan logic may be unused (e.g., shut down or off) by default. For example, a user design is provided that is complete as the design has been fully mapped, placed, and routed, with the functionality unchanged due to the added scan chain and associated scan logic which is by default switched off. However, for the scan-testable design version, a post-PAR tool may be used to further configure all registers, user I/Os, and clocks for scan testability and further enable the scan chain and associated scan logic, as discussed further herein. Therefore as an example, this process may minimize the differences between a user version (scan chain unused) and a scan testable version, which may thus achieve high fault coverage.

Figure 12:
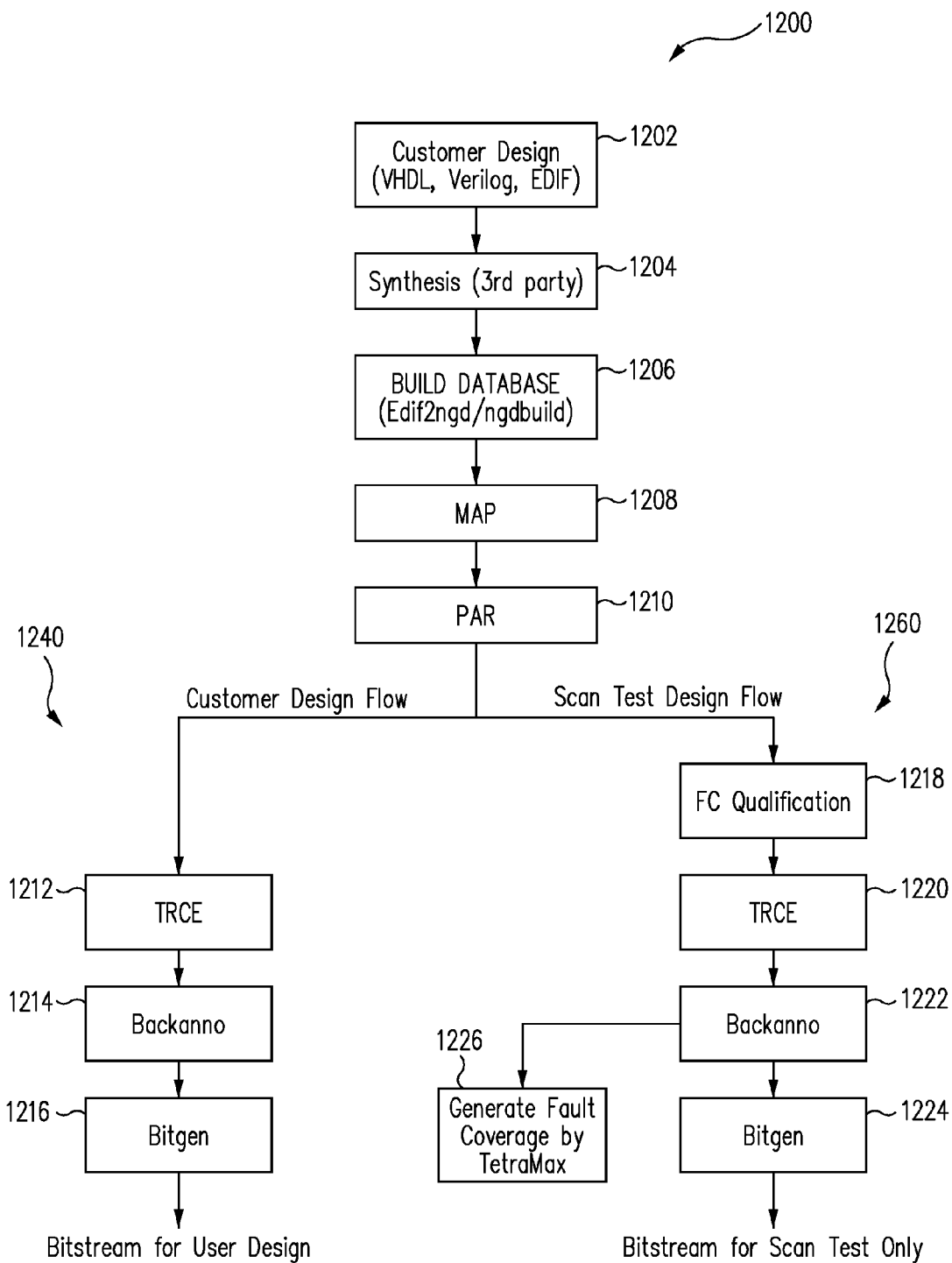
FIG. 12 shows a block diagram illustrating an example of a design flow overview, with specific customer design flow and scan test design flow branches, in accordance with an embodiment of the present invention.

In accordance with one or more embodiments of the present invention, the design methodology for scan-based testing (e.g., software flow providing for the insertion of a scan chain into the user's design) may provide for the generation of two versions of the bitstream (e.g., configuration data), one version for the user design and one version for design specific testing. As a specific example, FIG. 12 shows a block diagram illustrating an example of a design flow 1200, with a specific customer design flow branch 1240 and a scan test design flow branch 1260, in accordance with an embodiment of the present invention.

Design flow 1200 includes blocks 1202 through 1210, which for example may be viewed as being similar to corresponding blocks 854 through 862 that were previously discussed in reference to FIG. 8. For example, the customer design may be generated for the project in most formats, including VHDL, Verilog, EDIF, and compiled NGO format netlists (block 1202), with design synthesis performed (block 1204, e.g., using a third party software synthesis tool). A file is generated (block 1206, e.g., labeled build database or Edif2ngd/ngdbuild), which provides a file (e.g., a native generic database (NGD) file or equivalent industry file type, as would be understood by one skilled in the art) describing the logical design (e.g., netlist file) and which may be used by software for mapping the design to the desired PLD.

The map process (block 1208) may add the scan chain elements to the design automatically by the PLD design software, as discussed previously. For example, the JTAG interface (e.g., including TDI, TDO, TMS, and TCK pads) and related logic and ports (e.g., scan_in, scan_out, scan_enable (or scan_en), scan_mode, and scan_clock, as discussed in reference to FIG. 4 for FreedomChip mode) may be included during the map process. Also for example, registers (e.g., flip flops (FF)) may be replaced with multiplexed registers (e.g., with a self-loop of scan_out back to scan_in) and block wrappers may be implemented (e.g., for ASIC blocks or other non-logic blocks, such as block RAM, PCS logic, and/or system bus). Furthermore for example, loadable counters may be broken down and scan chain logic optimization may be performed. The map process may produce, for example, a map file (e.g., an NCD file or equivalent industry file type, as would be understood by one skilled in the art) with the scan chain and associated logic marked.

The PAR process (block 1210) may place all scan chain and scan logic/components simultaneously with the user-defined design (e.g., user's logic/components). Also as an example, after placement, the PAR process may break all self-looped scan chains and form all scan registers into a single scan chain based on placement, with this single scan chain hooked onto (or connected) to the JTAG interface. Thus, the PAR process may fully route the single scan chain.

After the PAR process, design flow 1200 branches to the specific customer design flow branch 1240 (customer design flow) and to the scan test design flow branch 1260 (scan test design flow). Customer design flow branch 1240 includes the trace process (block 1212), back annotation process (block 1214), and bit generation (block 1216) to provide the bitstream for the user's design, but with the scan chain and associated logic not enabled, as discussed herein and as would be understood by one skilled in the art.

Scan test design flow branch 1260 (scan test design flow) includes a qualification process (block 1218, e.g., Freedom-Chip (FC) qualification) in addition to the trace process (block 1220), back annotation process (block 1222), and bit generation (block 1224) to provide the bitstream for the user's design with scan-test enabled (e.g., with the scan chain and associated logic utilized). Furthermore, scan test design flow branch 1260 may include a test process (block 1226), which generates vectors (e.g., ATPG process) by using the exact user netlist based on the back annotated gate model equivalent (e.g., block 1222). For example, industry standard tools (e.g., Synopsys Tetramax) may be used to generate these vectors to achieve up to 99% or greater fault coverage. This may be referred to as the Fabric testing, because the great majority of the netlist is contained within the PLD fabric that includes the logic blocks (e.g., PFU) and the associated routing (e.g., programmable interconnect) of this logic. Furthermore, the user I/Os and the scan chain registers may be considered inputs and outputs by the ATPG tool and may be utilized in the generation of test vectors.

The qualification process (block 1218) may include removing all user clocks and replacing them with a single scan clock from JTAG (the JTAG scan interface), customizing registers (e.g., within the I/O and logic blocks) to make it scan testable (e.g., by editing its clock (clk), reset (LSR), and clock enable (CE) signals), and reconfiguring the contents or mode of certain blocks to make then scan testable. For example, the distributed RAM may be converted to ROM and various clock circuitry (e.g., PLL, DLL, DCS, clock dividers (CLKDIV)) may be reset. The qualification process generates a complete netlist file (e.g., writes out an NCD file, which includes physical placement information) that provides a fully routed single scan clock and scan chain, as would be understood by one skilled in the art.

In general, design flow 1200 may be viewed as providing a software flow solution to completely insert scan chain and related logic, block wrappers, and interface (e.g., JTAG) at an early map stage to provide certain advantages. For example, design flow 1200 may ensure that the scan chain and associated logic (e.g., associated circuitry) will be mapped, placed, and routed with the user logic. After PAR, the software flow branches to generate two versions of the bitstream, one version is for the normal user design and the other version is dedicated for design specific scan testing. By generating the separate bitstream for design specific scan testing, the customer design flow will be similar to the normal (conventional) PLD flow, which may help to make the software flow user-friendly.

The separate bitstream for design specific scan testing may further guarantee that any edition or reconfiguration to the design specific scan-testable version (e.g., during the scan test design flow) will not affect the bitstream of the normal user design version (e.g., customer design flow), which may ensure the sanity of the user's design. Additionally, by branching the software flow after PAR (block 1210), this software flow approach may minimize the differences between the two versions of the bitstream and may maximize the fault coverage. For example, by placing and routing the scan chain and logic/components simultaneously with the entire customer design, this process flow may guarantee that the user design with the additional scan chain may be fully placed and routed, with the same placement and approximately same routing between the two versions (e.g., customer design flow and scan test design flow).

Design flow 1200 may provide certain additional advantages. For example, by consolidating the scan chain, scan logic, interfaces, and wrapper insertions at the beginning of map, this may permit the map process (block 1208) to provide improved performance with minimal area overhead. Also, this process may permit these additional scan-related logic and components to be easily managed by the downstream tools (e.g., PAR (block 1210) and back annotation process (block 1222)). The user design in the customer design flow may also be relatively consistent and stable after map, because all of the necessary logic changes have already been done during the map process. Furthermore, the netlist may remain the same, except for the scan chain that has to be re-hooked during the router (PAR) process, but because the scan chain is shut down (e.g., disabled) for the customer design flow, the scan chain change essentially has no impact to the customer design flow.

The map process, which address the user design and scan chain, may further provide a more complete solution. For example, if the scan chain and related logic are not inserted completely during the map process or are not placed and routed along with user logic, the end result may be that a design is fully placed and routed in the customer design flow, but fails in the scan test design flow (e.g., the design is not scan testable), or both versions are fully placed and routed, but have different placement or routing (e.g., reduced fault coverage).

Another potential advantage of design flow 1200 is that all of the reconfigurations, such as for I/Os, registers, clocks, and the scan interface, to either convert them to scan testable or to activate the scan chain, are performed only during the scan test design flow (e.g., in the scan test design flow branch 1260 after PAR). Thus, these changes will not impact the bitstream provided by the customer design flow. Furthermore, these configuration changes will not require any placement change, which helps to ensure the high fault coverage. Although some elements (e.g., clock and set/reset nets) will have to be reconfigured for scan testing, no data path will be changed and therefore, the differences between the two versions is generally minimal, which may also help to ensure a high fault coverage.

Systems and methods are disclosed herein to provide improved test techniques for programmable devices, such as for example PLDs. For example, in accordance with an embodiment of the present invention, design specific testing of PLDs (e.g., FPGAs) are disclosed using scan-based testing, which may provide a methodology to accurately determine whether a specific user design will function properly in a PLD (e.g., within a defect free PLD or a partially defective PLD, such as one having one or more localized defects).

In contrast to conventional approaches, techniques disclosed herein, in accordance with one or more embodiments of the present invention, provide for a PLD design to be indigenously represented in a scan architecture that is compatible with industry standard ATPG tools. For example, techniques disclosed herein provide for the insertion of the required design elements and then back annotates the design into a library compatible netlist with the ATPG tool. This allows the generation of test vectors using industry standard tools.

Thus in accordance with some embodiments, a scan architecture implementation within the PLD is disclosed as well as a method to represent any specific PLD design as a gate level netlist that is compatible with industry standard ATPG tools. For example, the scan architecture may implement all registers in the user design as scan registers and then order and connect these registers into a scan chain. The scan architecture may also "wrap" all hard blocks in the specific PLD design to allow the ATPG tool to bypass these blocks and achieve maximum test coverage.

As a specific implementation example in accordance with one or more embodiments, a software flow and map, place, and route (MPAR) solution (e.g., a software methodology) is disclosed for inserting a scan chain into a PLD design, such as for example to support design specific testing for designs configured on partially defective PLDs (e.g., having interconnect or multiplexer defects). To properly configure a design on a partially defective PLD, thorough design specific testing should be performed with very high fault coverage, which may be accomplished in accordance with an embodiment by the insertion of the scan chain into a user design. In general in accordance with an embodiment, a seamless software flow solution is disclosed to insert scan logic, form the scan chain, and MPAR to provide a scan testable design version.

As a specific example in accordance with an embodiment, a PLD design flow is disclosed as a specific implementation example for inserting a scan chain and associated logic into a user design (e.g., during map, place, and route). The design flow may minimize the impact on a user, because the scan chain, related logic, block wrapper, and interfaces are inserted, mapped, placed, and routed automatically by the software (e.g., map and PAR) without any user involvement (e.g., completely transparent to the user). The design flow may provide improved performance with minimal area overhead, because the scan chain and additional logic may be inserted during map to optimize and merge with the user logic. The design flow may also provide a consistent result between the user design and its scan-testable version. For example, if the user design version can be fully placed and routed, then its scan-testable version can also, but if the scan-testable version cannot be fully placed and routed, then generally the user design version also cannot be fully placed and routed. Additionally, the design flow may provide a high fault coverage, because placing and routing the scan chain and scan logic simultaneously with the user logic may ensure that the scan-testable version has approximately the same placement and routing configuration as the user design version.

It should be understood that the techniques disclosed herein may be performed by software in combination with or separate from other industry standard software tools as disclosed herein. It should also be understood that one or more of the techniques disclosed herein may be performed by software (e.g., one or more computer programs for execution by a computer), stored on a computer-readable medium (e.g., portable memory such as a CD or flash memory or attached memory such as an internal hard drive).

The techniques disclosed herein may provide certain advantages over conventional approaches. For example, the techniques disclosed herein may provide no design conversion risk or expense as the same PLD used for initial design may be used as the platform for cost reduction. Thus, the design flow does not require any design migration from the PLD device to a structured ASIC-like device. This approach may result in a significant reduction in the time required to provide volume delivery of devices, while offering lower risk because the volume device is the same as the PLD in every physical and electrical characteristic.

For example, because the volume device is physically the same device as the PLD used for initial design, everything may be the same for designing the part onto a printed circuit board. The volume device may have the same physical size, layout, I/O configurations, voltages, timing, and/or thermal characteristics. Furthermore, the printed circuit board may be designed with the PLD used for initial design, with prototypes and early production versions of a design using the PLD of initial design with no risk of any physical or electrical differences once the volume device (e.g., FreedomChip part) is used for volume design.

As another example, the design flow process that implements techniques disclosed herein may be to some extent transparent to the user. For example, when a high volume PLD design is first being completed, it can be implemented in the PLD software (e.g., using FreedomChip flow or equivalent software scan test methodology for the specific PLD design software used for implementing scan-based testing) and still be used on a standard version of the PLD. Thus, the timing and area information reported for the implemented design may be identical whether receiving a standard version of the PLD (e.g., essentially defect-free) or a version of the PLD having one or more known defects. For designs that will be used in volume production applications, the scan test design flow may offer the best of both worlds. As a specific implementation example, if designs are implemented using the FreedomChip flow in Lattice software, all the design work may be completed and then initial prototypes and production may be used with standard Lattice SC devices. The design implementation may then be used in a FreedomChip part when volume production begins, with no additional design work or time required.

As another example, the techniques disclosed herein may provide verifiable quality assurance. For example, the design flow may benefit from the use of industry-standard test methodologies to allow lower costs and better device yields. Scan test methodology, used in ASIC designs for the past three decades, may be used for the logic fabric testing. Furthermore, advances in testing, such as better test vector generation software, may be adopted into the design flow as they are developed in the industry without requiring expensive proprietary development efforts. As a specific example, the largest EDA vendors currently provide leading-edge ATPG tools specifically for scan-based designs. However, if newer, more efficient versions or tools become available, these improvements may quickly be used in the design flow. Thus, the ability to rapidly adopt new technology may allow better yield and lower costs for customers.

In general, the use of scan test allows a complete, programmed design to be tested in the PLD. Consequently, all of the used logic, configuration bits, and complete routes may be tested, which helps to insure that the customer design is fully tested and working on the delivered PLD parts. Furthermore, the use of standard test reports from scan-based tools may allow customers to verify which parts of their designs have been tested and what coverage goals have been met. In contrast, conventional cost reduction methods test individual logic elements and partial routes in a PLD in a piecemeal fashion and thus, these partial methods do not guarantee that the complete functionality will be defect free when fully routed and configured for the final design. Thus, only testing of the complete configured and routed design, such as by using the techniques disclosed herein, may guarantee that no defects are present.

As another example, the low cost techniques disclosed herein may allow the fastest time to volume production. For example, by implementing PLD and scan testing methods as set forth herein, a customer design may be insured to be complete and the PLD manufacturer may be able to quickly deliver volume production parts. Thus in contrast to methods that require custom designed parts, the techniques disclosed herein for example may use standard PLD parts having a small number of defects.

Embodiments described above illustrate but do not limit the invention. It should also be understood that numerous modifications and variations are possible in accordance with the principles of the present invention. For example, although a JTAG interface is used for scan-based testing, this is not limiting as various other types of interfaces may be used, for example, to perform the scan-based testing and to provide a scan in signal to the PLD and receive a scan out signal from the PLD based on the techniques disclosed herein. Accordingly, the scope of the invention is defined only by the following claims.

What is claimed is:

1. A computer-implemented method of generating configuration data for a programmable logic device, the method comprising:

mapping a design for the programmable logic device, wherein the using a computer, mapped design incorporates scan test logic and the mapping includes substituting scan registers for registers within the design to provide a scan chain for the scan test logic;

placing and routing the mapped design, wherein the placing and routing includes placing and routing the scan chain; and generating configuration data based on the mapped design, wherein the incorporated scan test logic is disabled and not selectable within the programmable logic device configured with the configuration data.

2. The method of claim 1, further comprising generating a second configuration data based on the mapped design, wherein the incorporated scan test logic is enabled and selectable within the programmable logic device configured with the second configuration data.

3. The method of claim 2, wherein the generating the second configuration data further comprises:

converting the placed and routed design for implementation within the programmable logic device to a gate level netlist;

generating test vectors based on the gate level netlist; and testing the placed and routed design using the test vectors, wherein the generating of the test vectors uses automatic test pattern generation and is performed for every fault in the placed and routed design, and wherein the testing is performed using automatic test equipment.

4. The method of claim 2, wherein the generating the second configuration data further comprises:

converting the placed and routed design to a single clock domain; and customizing registers and input/output circuits within the placed and routed design to be scan testable.

5. The method of claim 1, wherein the mapping further comprises:

forming an input/output interface for the scan chain; and forming block wrappers for certain circuit blocks within the programmable logic device.

6. The method of claim 5, wherein the placing and routing further includes placing and routing the block wrappers to reconnect and route the scan chain based on physical locations of the scan registers to the input/output interface.

7. The method of claim 1, further comprising:

converting the placed and routed design for implementation within the programmable logic device to a gate level netlist;

generating test vectors based on the gate level netlist; and testing the placed and routed design using the test vectors, wherein the generating of the test vectors uses automatic test pattern generation and is performed for every fault in the placed and routed design, and wherein the testing is performed using automatic test equipment.

8. A non-transitory computer-readable medium on which is stored one or more computer programs for performing a method comprising:

mapping a design for a programmable logic device, wherein the mapped design incorporates scan test logic and the mapping includes substituting scan registers for registers within the design to provide a scan chain for the scan test logic;

placing and routing the mapped design, wherein the placing and routing includes placing and routing the scan chain; and generating configuration data based on the mapped design, wherein the incorporated scan test logic is disabled and not selectable within the programmable logic device configured with the configuration data.

9. The method of claim 8, further comprising generating a second configuration data based on the mapped design, wherein the incorporated scan test logic is enabled and selectable within the programmable logic device configured with the second configuration data.

10. The method of claim 9, wherein the generating the second configuration data further comprises:

converting the placed and routed design for implementation within the programmable logic device to a gate level netlist;

generating test vectors based on the gate level netlist; and testing the placed and routed design using the test vectors, wherein the generating of the test vectors uses automatic test pattern generation and is performed for every fault in the placed and routed design, and wherein the testing is performed using automatic test equipment.

11. The method of claim 9, wherein the generating the second configuration data further comprises:

converting the placed and routed design to a single clock domain; and customizing registers and input/output circuits within the placed and routed design to be scan testable.

12. The method of claim 8, wherein the mapping further comprises:

forming an input/output interface for the scan chain; and forming block wrappers for certain circuit blocks within the programmable logic device.

13. The method of claim 12, wherein the placing and routing includes placing and routing the block wrappers to reconnect and route the scan chain based on physical locations of the scan registers to the input/output interface.

14. The method of claim 8, further comprising:

converting the placed and routed design for implementation within the programmable logic device to a gate level netlist;

generating test vectors based on the gate level netlist; and testing the placed and routed design using the test vectors, wherein the generating of the test vectors uses automatic test pattern generation and is performed for every fault in the placed and routed design, and wherein the testing is performed using automatic test equipment.

\* \* \* \* \*

UNITED STATES PATENT AND TRADEMARK OFFICE
CERTIFICATE OF CORRECTION

| | | |
|---|---|---|
| PATENT NO. | : 7,757,198 B1 | Page 1 of 1 |
| APPLICATION NO. | : 11/875748 | |
| DATED | : July 13, 2010 | |
| INVENTOR(S) | : Jun Zhao, Yanhua Yi and Eric Ting | |

It is certified that error appears in the above-identified patent and that said Letters Patent is hereby corrected as shown below:

Col. 18, line 66:
"wherein the using a computer, mapped design" should read --wherein using a computer, the mapped design--

Signed and Sealed this
Twenty-eighth Day of August, 2012

David J. Kappos
*Director of the United States Patent and Trademark Office*